United States Patent [19]
Depetro et al.

[11] Patent Number: 6,043,532
[45] Date of Patent: Mar. 28, 2000

[54] DMOS TRANSISTOR PROTECTED AGAINST "SNAP-BACK"

[75] Inventors: Riccardo Depetro, Domodossola; Michele Palmieri, Settimo Milanese, both of Italy

[73] Assignee: SGS-Thomson Microelectronics S.r.l., Agrate Brianza, Italy

[21] Appl. No.: 08/965,840

[22] Filed: Nov. 7, 1997

[51] Int. Cl.⁷ .................................................. H01L 29/76
[52] U.S. Cl. ........................................... 257/335; 257/342
[58] Field of Search .................................... 257/335, 328, 257/344, 341, 336, 342, 343, 372, 373, 547

[56] References Cited

U.S. PATENT DOCUMENTS

| 4,831,423 | 5/1989 | Shannon | 357/23.4 |
| 5,182,222 | 1/1993 | Malhi et al. | |

FOREIGN PATENT DOCUMENTS

| 0571027A1 | 11/1993 | European Pat. Off. | 257/335 |
| 0 615 293 A1 | 3/1994 | European Pat. Off. | H01L 29/72 |
| 0 696 054 A1 | 2/1996 | European Pat. Off. | H01L 21/336 |
| 2 635 613 | 8/1989 | France | H01L 27/105 |
| 2 640 081 | 12/1989 | France | H01L 27/105 |
| 5-335559 | 12/1993 | Japan | 257/335 |

Primary Examiner—Sheila V. Clark
Assistant Examiner—H. D. Tran
Attorney, Agent, or Firm—Theodore E. Galanthay; Allen, Dyer, Doppelt, Milbrath & Gilchrist, P.A.

[57] ABSTRACT

The DMOS transistor includes an n drain region, a p body region which forms, with the drain region, a junction having at least one edge portion with a small radius of curvature, an n+ source region which delimits a channel in the body region, p+ body contact regions, a gate electrode, a source and body electrode, and a drain electrode. To prevent the "snap-back" phenomenon when the junction is reverse biased with the source, body and gate electrodes short-circuited, a p+ region is associated with each of the edge portions having a small radius of curvature and is arranged so as to be closer to the associated edge portion than any part of the source region.

10 Claims, 3 Drawing Sheets

DMOS TRANSISTOR PROTECTED AGAINST "SNAP-BACK"

FIELD OF THE INVENTION

The present invention relates to semiconductor devices, and, more particularly, to a DMOS transistor.

BACKGROUND OF THE INVENTION

DMOS transistors are double-diffused MOS (metal-oxide semiconductor) field-effect transistors and are used predominantly in power applications. LDMOS transistors, that is, those with lateral current conduction and VDMOS transistors, that is, those with vertical current conduction, belong to this class of transistors. FIGS. 1 and 2 show, in plan and in section, respectively, a portion of an LDMOS transistor with a conventional interdigitated structure. The transistor is formed on a monocrystalline silicon substrate 10 of which a portion defined by a major surface 9 is shown in the drawing. The transistor comprises:

- a first region 11 which has n-type conductivity, is a portion of an epitaxial layer, and provides the drain region of the transistor;
- a second region 12 which has p-type conductivity, is produced by implantation and subsequent diffusion of doping impurities in the first, or drain region 11, has elongate portions or fingers (only one of which is shown in the drawing), forms a p-n junction with the drain region 11, and provides the body region of the transistor;
- a strongly-doped third region 13 which has n-type conductivity (indicated n+ in the drawing), and which provides the source region of the transistor and, with the edges of the body region 12, defines a portion 16 of the body region which provides the channel of the transistor;
- a strongly-doped fourth region 14 which has p-type conductivity (indicated p+ in the drawing) and which, in the embodiment shown, is composed of various elemental parts (all indicated 14 in FIG. 1) which extend from the major surface 9 and through the source region 13, establishing contact with the body region 12;
- a first electrode 17, for example, of doped polycrystalline silicon, which is insulated from the monocrystalline silicon surface 9 by a thin dielectric layer, preferably of silicon dioxide, overlies the channel 16, and is connected to the gate terminal G of the transistor;
- a second electrode 18, for example of aluminium, which is in electrical contact with the third and fourth regions 13 and 14, respectively, on the major surface 9 and thus electrically interconnects the source region 13 and the body region 12 on the surface, and which is connected to a terminal, indicated S in the drawing, of the transistor; and
- a third electrode 19, for example, also of aluminium, in electrical contact with the first or drain region 11 on the major surface 9 through a strongly-doped n-type region 21 which favours an ohmic contact between aluminium and silicon, and providing the drain terminal D of the transistor.

An important electrical characteristic of transistors of the type described above is reverse conduction between the source and drain, with the body, source and gate short-circuited. As is known, conduction starts when the voltage $V_{DS}$ between the drain and source reaches a value such as to bring about reverse conduction in the junction between the body region 12 and the drain region 11. This value, which is indicated as the breakdown voltage $BV_{DSS}$, is determined by the physical and geometrical characteristics of the transistor. For the transistor to operate correctly in these conditions, the voltage $V_{DS}$ must remain constant irrespective of the drain current $I_D$, as shown in FIG. 3. In certain cases, however, the characteristic $V_{DS}=f(I_D)$ deviates considerably from the desired characteristic since, as shown in FIG. 4, the voltage $V_{DS}$ remains substantially constant at the value $BV_{DSS}$ only for relatively low drain currents and decreases significantly and rapidly for higher currents. This phenomenon, known as "snap-back" considerably limits the field of use of the transistor.

The known behavior described above is attributed to the switching-on of a parasitic bipolar (NPN) transistor which has the source region 13 as an emitter, the body region 12 as a base, and the drain region 11 as a collector. A transistor of this type is shown by broken lines and indicated Tp in FIG. 2. In operation, the current $I_D$ which passes through the body region 12 during the breakdown of the body-drain junction in fact causes a voltage drop within the body region 12 because of its distributed resistance represented by a resistor Rd in series with the base of the transistor Tp. When this voltage drop exceeds the direct conduction threshold of the base-emitter junction, the parasitic transistor starts to conduct so that the voltage $V_{DS}$ decreases suddenly.

To prevent or attenuate this problem, that is, to shift the switching-on of the parasitic transistor towards higher current values $I_D$, the doping of the body region 12 is normally increased to reduce the distributed resistance of this region. In certain cases, however, it is impossible or undesirable to increase this doping so as not to forego other characteristics of the transistor or so as not to complicate the normal manufacturing process with additional operations.

SUMMARY OF THE INVENTION

The object of the present invention is to provide a DMOS transistor in which the phenomenon described above does not occur or occurs only at very high currents.

This and other objects, features and advantages in accordance with the present invention are provided by a DMOS transistor comprising: a first region having a first type of conductivity and delimited by a major surface of the substrate; a second region having a second type of conductivity extending into the first region from the major surface and forming with the first region a junction having at least one edge portion with a relatively small radius of curvature; a third region having the first type of conductivity extending from the major surface into the second region and delimiting a channel with the at least one edge portion of the second region; and a fourth region having the second type of conductivity and extending from the major surface to contact the second region. The DMOS transistor includes a first electrode which is electrically insulated from the major surface and which overlies the channel; a second electrode which is in electrical contact with the third region and with the fourth region on the major surface; and a third electrode which is in electrical contact with the first region. Moreover, the DMOS transistor preferably includes a fifth region having the second type of conductivity and extending from the major surface into the second region in a position such as to be closer to an associated at least one edge portion with the relatively small radius of curvature than any part of the third region.

The second electrode may be in electrical contact with the fifth region on the major surface. In addition, each of the third region and the fifth region may have an edge substantially aligned with the first electrode. The fourth region and the fifth region may coincide. And the fourth region preferably extends through the third region and defines an elemental portion of a body contact region.

BRIEF DESCRIPTION OF THE DRAWINGS

The invention will be understood better from the following detailed description of two embodiments thereof given by way of non-limiting example with reference to the appended drawings, in which.

DETAILED DESCRIPTION OF THE PREFERRED EMBODIMENTS

The invention is based upon the realization that the switching-on of the parasitic transistor Tp is triggered in the vicinity of the edge portions of the p-n junction between the body region 12 and the drain region 11 in which the radius of curvature is smallest. In the structure shown in FIGS. 1 and 2, these edge portions are the corners of the elongate body region, shown by circles drawn in dashed line and indicated 20 in FIG. 1. In fact, it is known that the electric field which is established in the depletion region of a p-n junction polarized in reverse is more intense in the regions in which the radius of curvature between the p and n regions is smallest, so that reverse conduction through this region starts at a voltage lower than that necessary to initiate reverse conduction of the straight portions of the junction.

Figure 1:
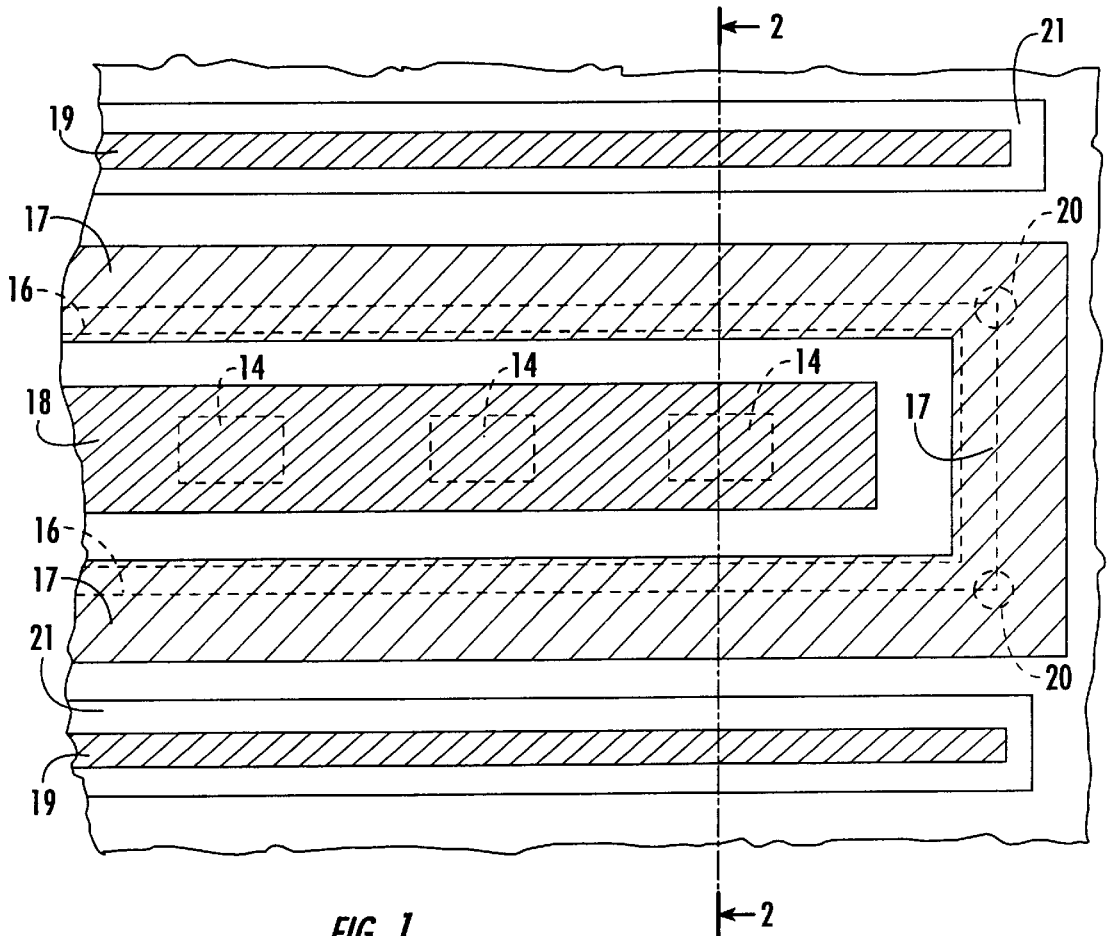
FIG. 1 shows, in plan, a portion of a prior art LDMOS transistor.
Figure 2:
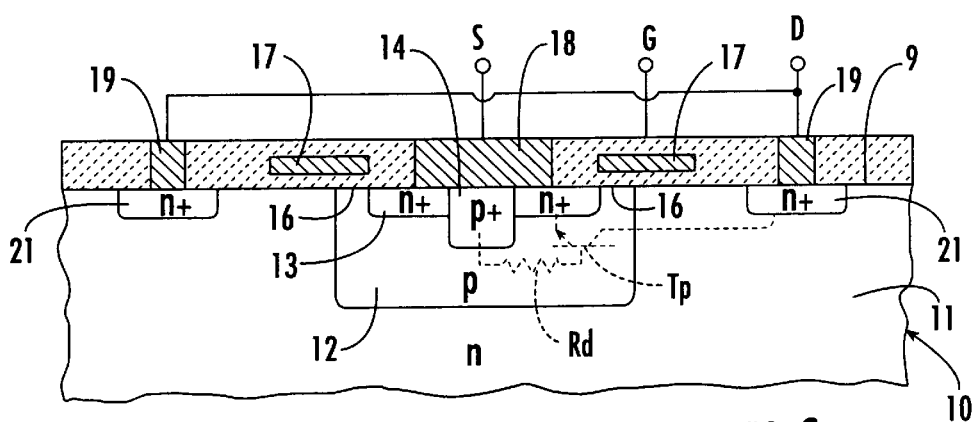
FIG. 2 is a section taken on the line II—II of FIG. 1.
Figure 5:
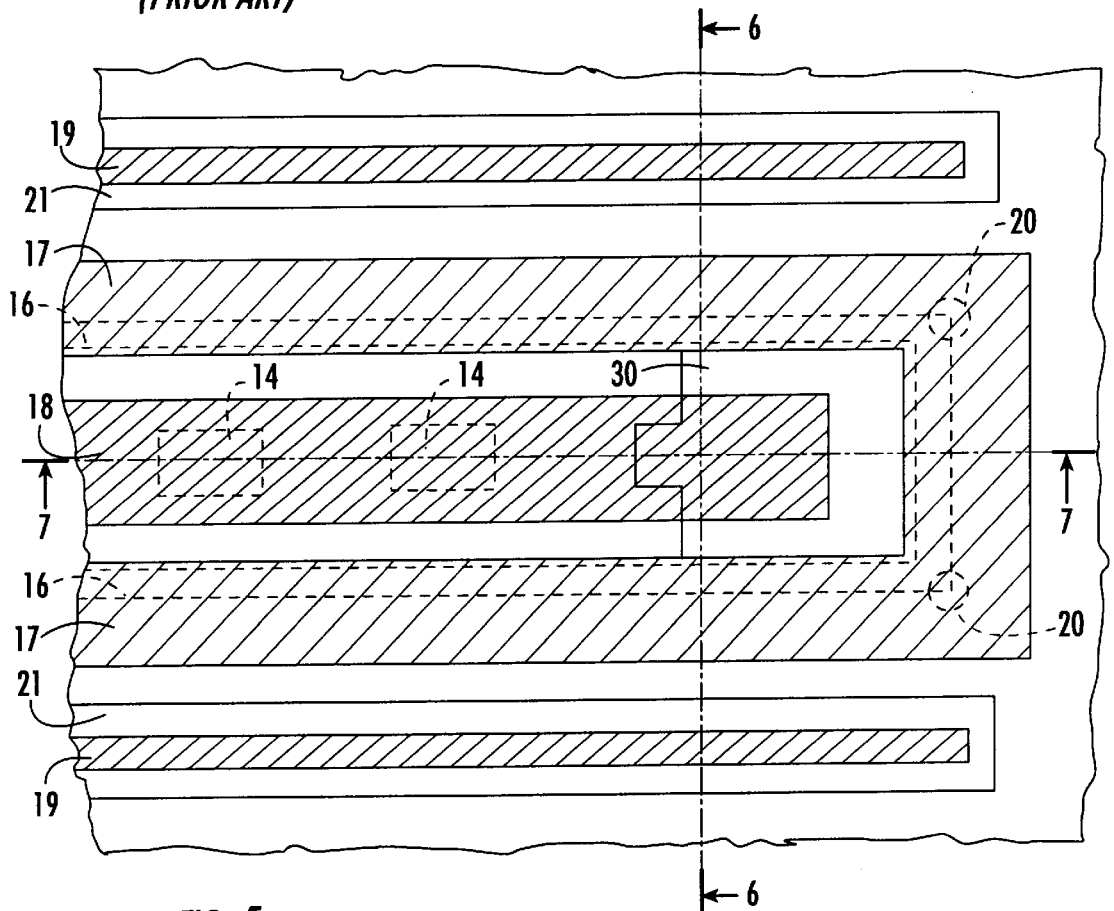
FIG. 5 shows, in plan, a portion of an LDMOS transistor according to a first embodiment of the invention.
Figure 6:
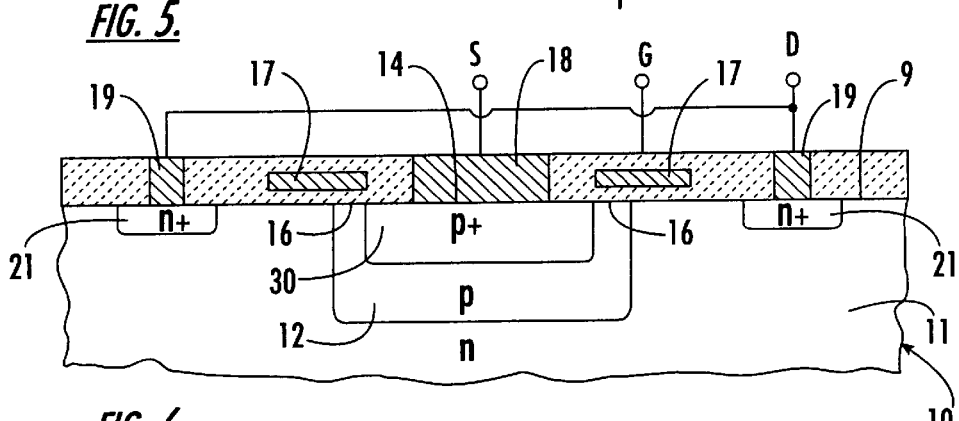
FIG. 6 is a section taken on the line VI—VI of FIG. 5.
Figure 7:
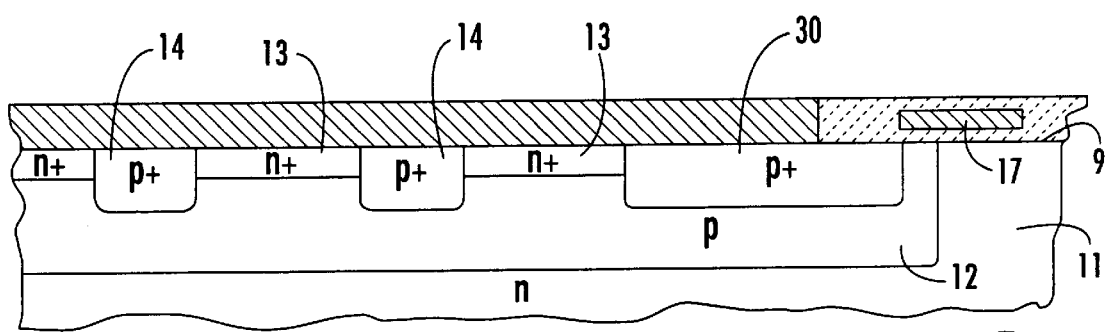
FIG. 7 is a section taken on the line VII—VII of FIG. 5.

With reference to FIGS. 5, 6 and 7, in which parts identical or corresponding to those of the known transistor shown in FIGS. 1 and 2 are indicated by the same reference numerals. According to the invention, a strongly doped p-type region, indicated 30, is associated with the corners 20 of the elongate body region. This region 30 extends into the body region 12 taking the place of the end portion of the n source region 13 of the known transistor of FIGS. 1 and 2 and is in surface electrical contact with the second electrode 18.

Figure 3:
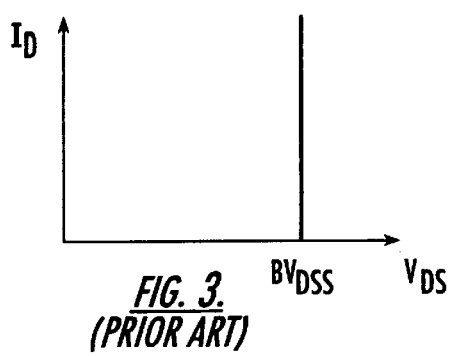
FIG. 3 is a graph showing a theoretical electrical characteristic of an LDMOS transistor with its source, body and gate short-circuited.
Figure 4:
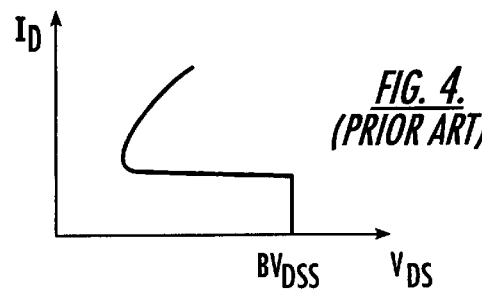
FIG. 4 is a graph showing an actual electrical characteristic of a known LDMOS transistor.

As can be seen, the region 30 is closer to the aforementioned corners than any part of the source region 13. When the transistor is polarized as described above with reference to FIGS. 3 and 4, the current $I_D$ which passes through the body-drain junction is collected by the body and source electrode 18 directly through the region 30, and a voltage drop sufficient to trigger the switching-on of the NPN parasitic transistor formed by the source, body and drain regions cannot therefore develop in the body region 12. The characteristic $V_{DS}=f(I_D)$ will therefore be very similar to the theoretical one shown in FIG. 3.

It should be noted that the region 30 can be formed without operations additional to the normal process for the manufacture of the transistor. In fact, it can be produced simply by modification of the masks necessary for the formation of the regions 13 and 14 and, precisely, by modification of the mask for the region 13 so as to prevent n+ doping in the end portion of the elongate portion 12, and modification of the mask for the region 14 so as to permit p+ doping both in the areas intended for the body contact regions and in the end portion which is protected against n+ doping.

Figure 8:
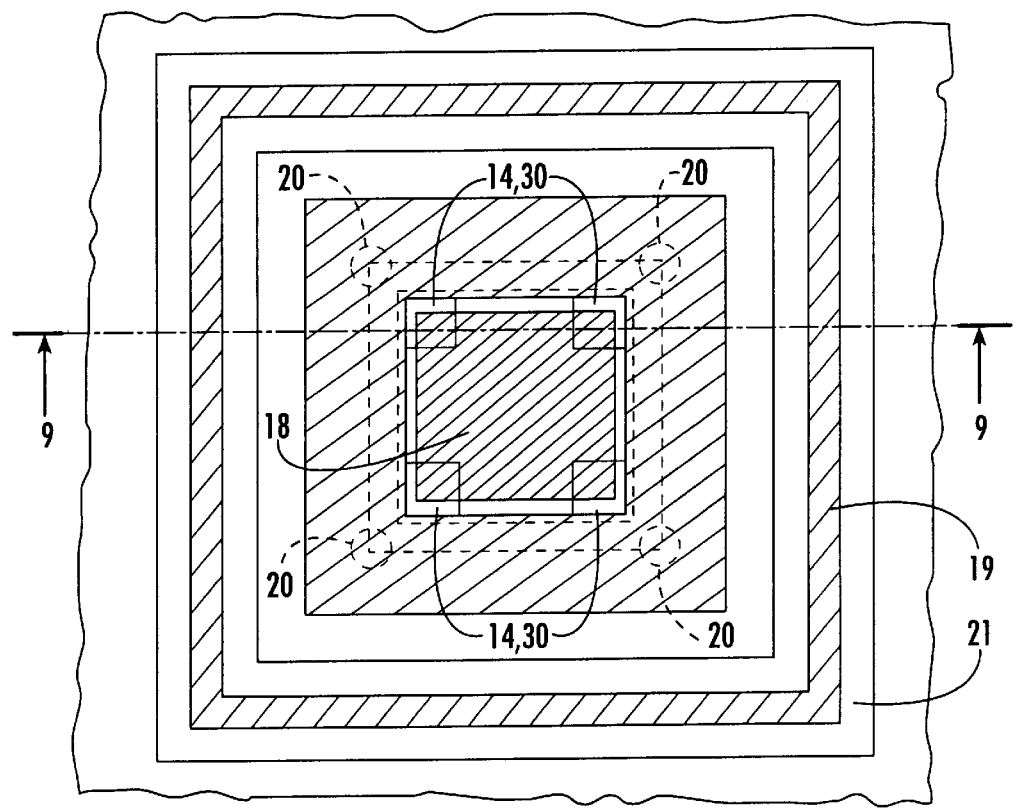
FIG. 8 shows, in plan, a portion of an LDMOS transistor according to a second embodiment of the invention.
Figure 9:
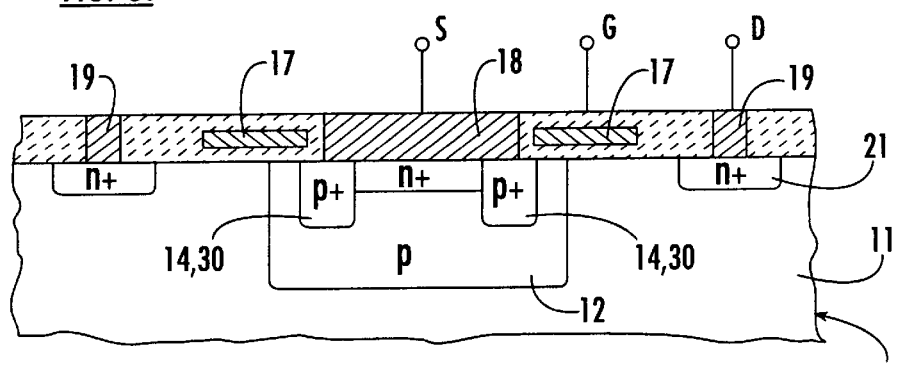
FIG. 9 is a section taken on the line IX—IX of FIG. 8.

The second embodiment of the invention differs from that described above solely in that the structure of the transistor is not interdigitated but composite, that is, it is provided by a plurality of elemental LDMOS transistors connected in parallel with one another. FIGS. 8 and 9 show an elemental LDMOS transistor which, in this embodiment, is square. Parts identical or corresponding to those of the first embodiment are indicated by the same reference numerals so that a further description of these figures is not necessary. It suffices to point out that each of the four edge regions of the body-source junction which have small radii of curvature and which are also shown by circles drawn in dashed line in this embodiment, is associated with a strongly doped p-type region which has the same function as the region 30 of the first embodiment, and is therefore indicated by the same reference numeral. Moreover, in this embodiment, the p+ body contact region coincides with the region 30, region 30 meaning the four regions indicated by this numeral in FIGS. 8 and 9, taken in combination.

In both of the embodiments described above, the source region 13 and the region 30 are advantageously formed by the use of the gate electrode 17 as a mask so that they have an edge substantially aligned with the inner edge of the gate electrode.

Although only two embodiments of the invention have been described and illustrated, clearly many variations and modifications are possible within the scope of the same inventive concept. For example, the p+ region 30 of the first embodiment could be limited solely to the portions of the source region 13 which are directly facing the edge portions of the body-drain junction having small radii of curvature and could thus be constituted by two regions similar to those provided at the corners of the square which delimits the source region in the second embodiment (FIG. 8). Moreover, the invention applies not only to LDMOS transistors, but also to VDMOS transistors, that is, those with vertical current flow, and can be implemented with the same advantages in a dual version of the devices shown and described, that is, with n regions in place of the p regions and p regions in place of the n regions.

That which is claimed is:

1. A DMOS transistor formed in a substrate and comprising:

a first region having a first type of conductivity and delimited by a major surface of the substrate;

a second region forming a body region having a second type of conductivity extending into the first region from the major surface and forming with the first region a junction having at least one edge portion with a relatively small radius of curvature in top, plan section;

a third region having the first type of conductivity extending from the major surface into the second region and delimiting a channel with the at least one edge portion of the second region;

a fourth region having the second type of conductivity and extending from the major surface to contact the second region;

a first electrode which is electrically insulated from the major surface and which overlies the channel;

a second electrode forming a source electrode which is in electrical contact with the third region and with the fourth region on the major surface;

a third electrode which is in electrical contact with the first region; and a fifth region having the second type of conductivity and extending from the major surface into the second region in a position such as to be closer to an associated at least one edge portion with the relatively small radius of curvature formed by the junction of the second region and extending into the body region than any part of the third region, wherein said second electrode is in electrical contact with the fifth region on the major surface, such that no portion of the third region between the fifth region is connected to the second electrode and first electrode in the region of the edge portion having the relatively small radius of curvature.

2. A transistor according to claim 1, wherein each of the third region and the fifth region has an edge substantially aligned with the first electrode.

3. A transistor according to claim 1, in which the fourth region and the fifth region coincide.

4. A transistor according to claim 1, in which the fourth region extends through the third region and defines an elemental portion of a body contact region.

5. A transistor according to claim 4, in which the second region has parts which are elongate so as to form an interdigitated structure with the first region and each of which defines, at one end, two edge portions with relatively small radii of curvature both of which are associated with the common fifth region, and in which the third region has elongate portions within the elongate parts.

6. A transistor according to claim 1, wherein the first conductivity type is n, and the second conductivity type is p.

7. A DMOS transistor formed in a monocrystalline silicon substrate and comprising:

a first region having a first type of conductivity and delimited by a major surface of the substrate;

a second region forming a body region having a second type of conductivity extending into the first region from the major surface and forming with the first region a junction having at least one edge portion with a relatively small radius of curvature in top, plan section;

a third region having the first type of conductivity extending from the major surface into the second region and delimiting a channel with the at least one edge portion of the second region;

a fourth region having the second type of conductivity and extending from the major surface to contact the second region;

a first electrode which is electrically insulated from the major surface, which overlies the channel, and which is connected to a gate terminal of the transistor;

a second electrode forming a source electrode which is in electrical contact with the third region and with the fourth region on the major surface and which is connected to a source terminal of the transistor;

a third electrode which is in electrical contact with the first region and is connected to a drain terminal of the transistor;

a fifth region having the second type of conductivity and extending from the major surface into the second region in a position such as to be closer to an associated at least one edge portion with the relatively small radius of curvature formed by the junction of the second region and extending into the body region than any part of the third region; and said second electrode being in electrical contact with the fifth region on the major surface, wherein each of the third region and the fifth region has an edge substantially aligned with the first electrode, and the fourth region and the fifth region coincide, such that no portion of the third region between the fifth region is connected to the second electrode and first electrode in the region of the edge portion having the relatively small radius of curvature.

8. A transistor according to claim 7, in which the fourth region extends through the third region and defines an elemental portion of a body contact region.

9. A transistor according to claim 8, in which the second region has parts which are elongate so as to form an interdigitated structure with the first region and each of which defines, at one end, two edge portions with relatively small radii of curvature both of which are associated with the common fifth region, and in which the third region has elongate portions within the elongate parts.

10. A transistor according to claim 7, wherein the first conductivity type is n, and the second conductivity type is p.

* * * * *

UNITED STATES PATENT AND TRADEMARK OFFICE
CERTIFICATE OF CORRECTION

PATENT NO. : 6,043,532
DATED : March 28, 2000
INVENTOR(S) : Depetro et al

It is certified that error appears in the above-identified patent and that said Letters Patent is hereby corrected as shown below:

On the title page: Item [30] Foreign Application Priority Data:
insert the following:  -- Nov. 11, 1996   [EP] European Pat. Off.
............ 96830575.5 --.

Signed and Sealed this

Twentieth Day of February, 2001

Attest:

NICHOLAS P. GODICI

Attesting Officer

Acting Director of the United States Patent and Trademark Office